United States Patent
Zeller

(10) Patent No.: US 11,815,578 B2
(45) Date of Patent: Nov. 14, 2023

(54) METHOD AND SYSTEM FOR AVOIDING ARTIFACTS DURING THE ACQUISITION OF MR DATA

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/726,912

(22) Filed: Apr. 22, 2022

(65) Prior Publication Data
US 2022/0342017 A1    Oct. 27, 2022

(30) Foreign Application Priority Data
Apr. 23, 2021  (DE) .................. 102021204074.8

(51) Int. Cl.
*G01R 33/54*   (2006.01)
*G01R 33/565*   (2006.01)

(52) U.S. Cl.
CPC ......... *G01R 33/543* (2013.01); *G01R 33/565* (2013.01)

(58) Field of Classification Search
CPC ............ G01R 33/543; G01R 33/565; G01R 33/5608; G01R 33/482; G01R 33/56545; G01R 33/56341
See application file for complete search history.

(56) References Cited

U.S. PATENT DOCUMENTS

| 7,840,045 B2* | 11/2010 | Guo | G01R 33/5611 324/309 |
|---|---|---|---|
| 2018/0081015 A1* | 3/2018 | Gebhardt | G01R 33/5611 |
| 2020/0225303 A1 | 7/2020 | Heidemann et al. | |

FOREIGN PATENT DOCUMENTS

EP    3683595 A1    7/2020

OTHER PUBLICATIONS

Frost, Robert et al. "Implementation and Assessment of Diffusion-Weighted Partial Fourier Readout-Segmented Echo-Planar Imaging" Magnetic Resonance in Medicine, vol. 68, pp. 441-451, 2012 // DOI 10.1002/mrm.23242.

Peng, Haidong et al: "MR image reconstruction of sparsely sampled 3D k-space data by projection-onto-convex sets"; Magnetic resonance imaging; Year: 2006, vol. 24, No. 6, pp. 761-773.

(Continued)

*Primary Examiner* — G.M. A Hyder
(74) *Attorney, Agent, or Firm* — Banner & Witcoff Ltd.

(57) ABSTRACT

In a method for avoiding artifacts during acquisition of MR data, a first measurement data set (MDS) of a target region of the examination object and at least one second MDS of the target region are acquired, and a combined MDS is created based on the acquired data sets. The first MDS does not sample a first region of k-space to be sampled according to Nyquist and corresponding to a first partial factor, and a second MDS does not sample a second region of k-space to be sampled according to Nyquist and corresponding to a second partial factor. The first and second regions of the k-space are different from each other. Advantageously, a k-space region acquired in none of the acquisitions made can be minimized by the inventive variation in the respective sampling pattern of the acquired MDS, so artifacts are reduced/avoided in MR images reconstructed from the MDS.

17 Claims, 5 Drawing Sheets

(56) References Cited

OTHER PUBLICATIONS

Porter, David A et al: "High resolution diffusion-weighted imaging using readout-segmented echo-planar imaging; parallel imaging and a two-dimensional navigator-based reacquisition"; Magnetic Resonance in Medicine; vol. 62; No. 2; May 15, 2009; pp. 468-475; XP055130037; ISSN: 0740-3194; DOI: 10.1002/mrm.22024; 2009.
Gutberlet M. et al.: SNR-optimized myocardial perfusion imaging using parallel acquisition for efffective density-weighted saturation recovery imaging, Institut für Röntgendiagnostic, Magn.eson. Imaging 28 (2010) 341-350.

* cited by examiner

FIG 2
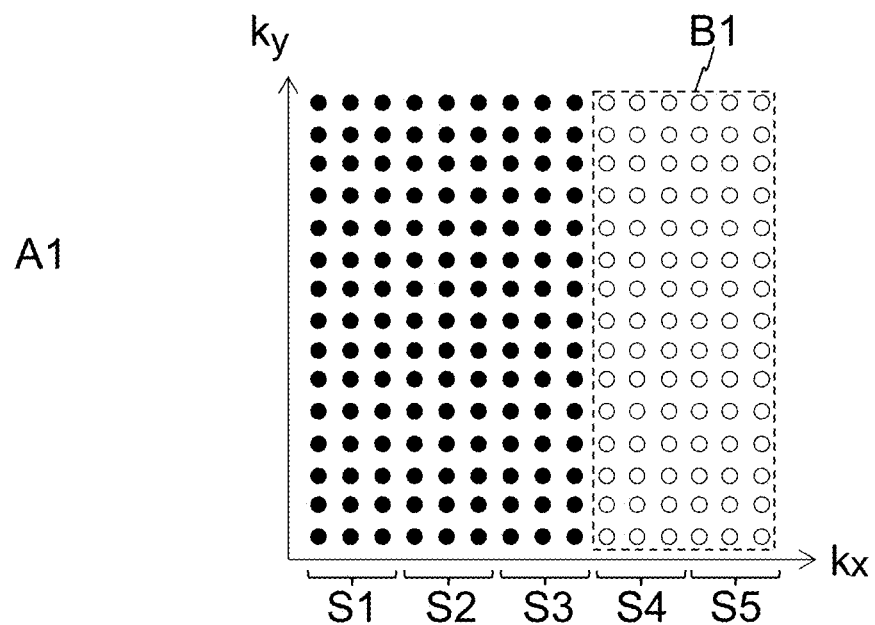
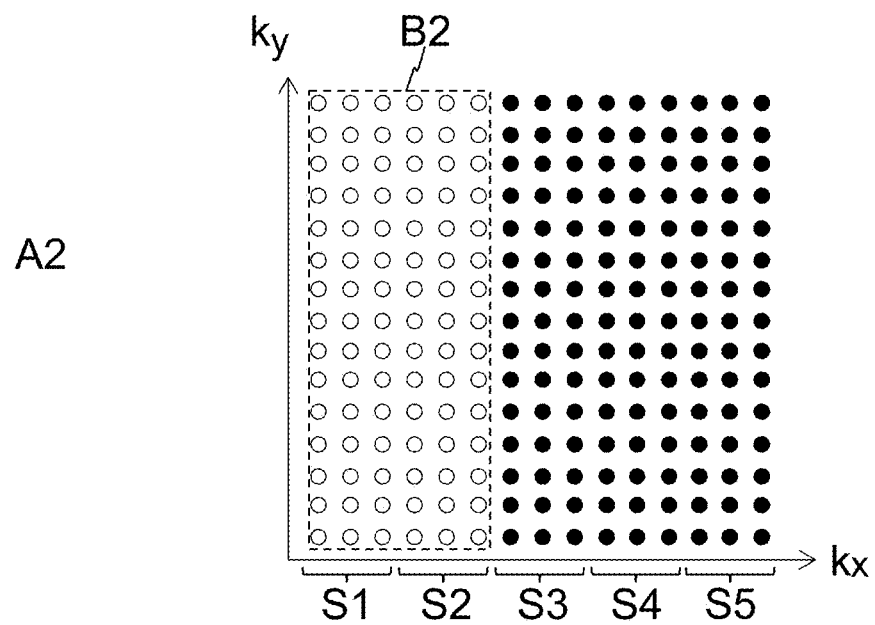

METHOD AND SYSTEM FOR AVOIDING ARTIFACTS DURING THE ACQUISITION OF MR DATA

CROSS REFERENCE TO RELATED APPLICATIONS

This patent application claims priority to German Patent Application No. 102021204074.8, filed Apr. 23, 2021, which is incorporated herein by reference in its entirety.

BACKGROUND

Field

The disclosure relates to a method for avoiding artifacts during the acquisition of MR data.

Related Art

Magnetic resonance technology (hereinafter the abbreviation MR stands for magnetic resonance) is a known technology with which images of the inside of an examination object can be generated. In simple terms, the examination object is positioned for this purpose in a comparatively strong static, homogeneous basic magnetic field, also called a B0 field, with field strengths of 0.2 tesla to 7 tesla and above, in a magnetic resonance device, so the nuclear spins thereof are oriented along the basic magnetic field. In order to resolve nuclear spin resonances which can be measured as signals, radio-frequency excitation pulses (RF pulses) are irradiated into the examination object, the resolved nuclear spin resonances are measured as what is known as k-space data and on the basis of this data MR images are reconstructed or spectroscopy data is ascertained. In order to spatially encode the measurement data, the basic magnetic field is overlaid with fast-switched magnetic gradient fields, called gradients for short. A pattern that is used, which describes a chronological sequence of RF pulses to be irradiated and gradients to be switched, is called a pulse sequence (pattern), or also a sequence for short. The recorded measurement data is digitized and stored as complex numerical values in a k-space matrix. An associated MR image can be reconstructed, for example by means of a multi-dimensional Fourier transform, from the k-space matrix occupied by values.

To improve the signal to noise ratio (SNR) in MR measurements or to reduce a sensitivity of the measurement to movement and/or flux it is already customary in many acquisitions to acquire measurement data multiple times in order to be able to average the measurement data or, for example, the reconstructed image data.

Furthermore, it is also necessary in some examinations, however, to carry out a plurality of, in other words a whole series of, magnetic resonance scans of the examination object, with one particular measurement parameter being varied. The effect of this measurement parameter on the examination object is observed on the basis of the measurements in order to then subsequently draw diagnostic conclusions therefrom. A series is taken to mean at least two, but as a rule more than two, acquisitions of measurement data sets. A measurement parameter is expediently varied such that the contrast of a particular type of material excited during the measurements, for example a tissue type of the examination object or a chemical substance, which is significant to most or particular tissue types, such as water, is influenced as much as possible by the variation in the measurement parameter. This ensures that the effect of the measurement parameter on the examination object can be seen particularly easily.

A typical example of series of magnetic resonance scans where the variation in a measurement parameter greatly influencing the contrast is what is known as diffusion weighting imaging (DWI). Diffusion is taken to mean the Brownian motion of molecules in a medium. In diffusion weighting imaging, as a rule a plurality of images with different directions and weightings of diffusion are acquired and combined with each other. The strength of the diffusion weighting is usually defined by what is known as the "b value". The diffusion images with different directions and weightings of diffusion or the images combined therefrom can then be used for diagnostic purposes. Parameter maps with particular diagnostic significance, such as maps which reproduce the "Apparent Diffusion Coefficient (ADC)" or the "Fractional Anisotropy (FA)", can then be generated by suitable combinations of the acquired diffusion-weighted images.

With diffusion-weighted imaging, additional gradients, which reflect a respective diffusion direction and a respective diffusion weighting, are inserted into a pulse sequence in order to render the diffusion properties of the tissue visible or to measure them. These gradients result in tissue with faster diffusion (for example cerebral spinal fluid, CSF) being subjected to a greater signal loss than tissue with slower diffusion (for example the grey substance in the brain, "grey matter"). The diffusion contrast resulting therefrom is clinically increasingly more significant and applications in the meanwhile go far beyond the conventional early detection of ischemic stroke.

Diffusion imaging is frequently based on echo planar imaging (EPI) owing to the short acquisition time of the EPI sequence per image and its robustness with respect to movement.

MR images acquired by means of EPI methods can have local geometric distortions, which are caused by inhomogeneities in the basic magnetic field. The inhomogeneities can be brought about by jumps in susceptibility at tissue boundaries, for example at transitions from air to tissue of the examination object, for example in human or animal patients as the examination object transitions from bone to softer tissue, and result in local phase accumulations over the readout echo train of the EPI measurement. To minimize the severity of the geometric distortions it is possible to attempt to minimize the phase accumulation. For this, for example the echo train can be kept as short as possible, although this restricts the spatial resolution, or parallel imaging techniques can be used.

It is also possible to acquire the k-space in segments, in other words to acquire measurement data in segments. Basically, the k-space can be segmented in the phase encoding direction and/or in the readout direction.

The RESOLVE sequence described for the first time in the article by Porter and Heidemann "High Resolution Diffusion-Weighted Imaging Using Readout-Segmented Echo-Planar Imaging, Parallel Imaging and a Two-Dimensional Navigator-Based Reacquisition", MRM 62, 2009, pages 468-475, is a variant of an EPI-like sequence in which segmenting takes place in the readout direction instead of in the phase encoding direction. A RESOLVE sequence can be combined with a diffusion preparation and/or with navigator measurements.

Generally speaking, with a RESOLVE sequence it is possible to define, after a diffusion preparation by way of a prephasing gradient, the segment of the k-space which is to be filled in the following readout phase with measurement data. In the readout phase, a train of echo signals is captured as measurement data for the defined segment by means of a sinusoidal readout gradient. By means of a further gradient, which has a polarity opposed to the prephasing gradient and can subsequently be switched at the readout phase, it is possible to return in the readout direction to the k-space center again before a further refocusing pulse can be irradiated, which results in the formation of further echo signals, which are captured by means of a navigator readout gradient as navigator data of the k-space center. The navigator data thus acquired for each segment can be used to compensate possible changes in phase between capturing the measurement data in the individual segments, as is described in more detail in the article by Porter and Heidemann already mentioned above.

In order to shorten the duration of an acquisition of a complete measurement data set according to Nyquist, under certain conditions it is possible to not acquire particular measurement data of the complete set and for it to be supplemented later instead. Less time is required for the acquisition of an incomplete measurement data set than for acquisition of a complete measurement data set. A method of this kind is, for example, a partial Fourier (PF) technique. With PF techniques, conventionally only part of the k-space, given by a PF factor and determined, moreover, by considerations of symmetry of the k-space, is sampled, in other words acquired or measured and not the entire k-space. With PF techniques the symmetry of the k-space is used to supplement or fill the part of the k-space that has not been measured with the aid of different reconstruction methods. With a method referred to as "zero-filling", regions of the k-space that are not acquired are filled by zeroes or zero values. This is a very simple method requiring little computing power.

An alternative method in order to supplement measurement data that has not been acquired in PF methods uses what is known as a POCS algorithm (Projection Onto Convex Sets), which estimates missing parts, in other words parts of the k-space of a measurement data set that have not been measured, in an iterative process and ensures a data consistency with the actually measured parts of the k-space of the measurement data set, in other words actually measured k-space values. Reference should be made in this regard, for example, to the publication "Implementation and Assessment of Diffusion-Weighted Partial Fourier Readout-Segmented Echo-Planar Imaging" by Robert Frost et. al. in Magnetic Resonance in Medicine 68:441-451 (2012). This methodology can result in an improved definition or spatial resolution, but cannot always be reliably applied, for example depending on particular phase variations in the underlying measurement data set.

It is precisely in segmented acquisition techniques such as, in particular, the RESOLVE technique mentioned above which is susceptible to changes in phase, that phase inconsistencies contained in the measurement data sets between the individual segments in connection with PF techniques can result in artifacts, in particular what are known as ringing artifacts and/or grid-like mesh artifacts.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIGS. 2-4 show examples of measurement data to be acquired in the k-space for inventive first and second measurement data sets, according to an exemplary embodiment of the disclosure.

Figure 1:
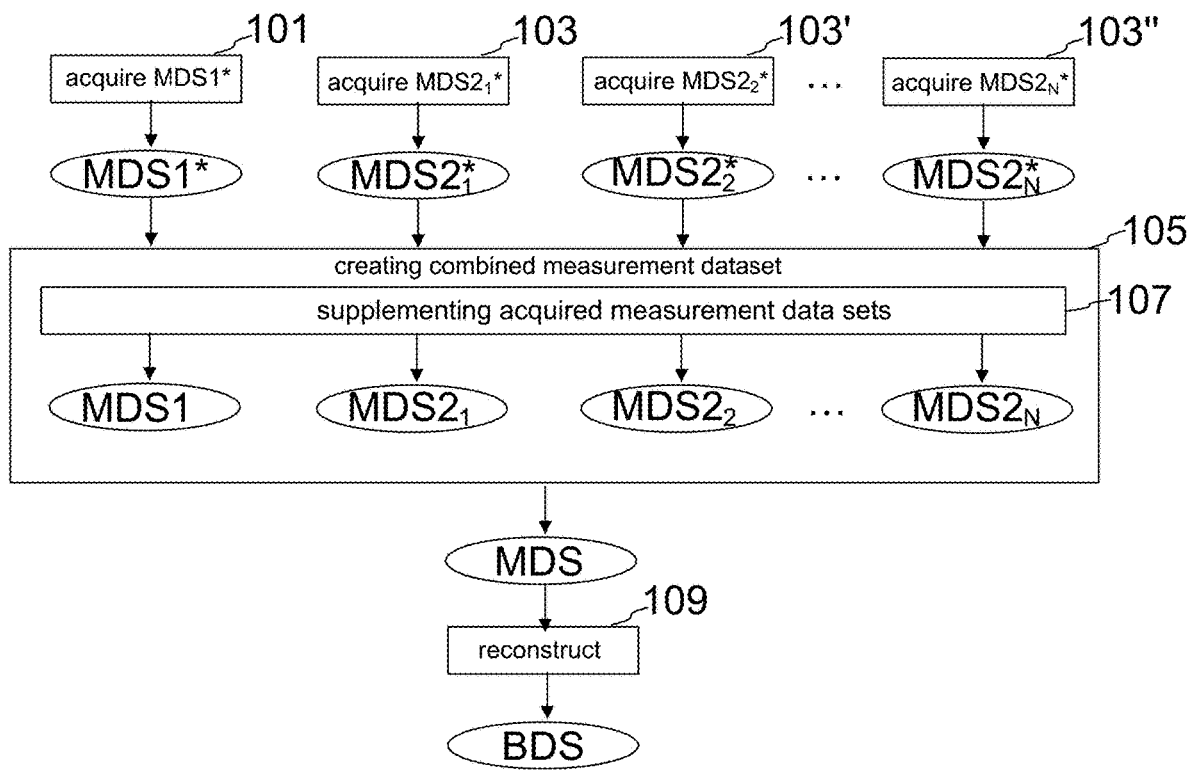
FIG. 1 shows a flowchart of a method for avoiding artifacts during the acquisition of MR data according to an exemplary embodiment of the disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object underlying the disclosure is to prevent artifacts in connection with PF methods.

In an exemplary embodiment, a method for avoiding artifacts during the acquisition of MR data of an examination object comprises:
acquiring a first measurement data set of a target region of the examination object, wherein the first measurement data set does not sample a first region of a k-space to be sampled according to Nyquist and corresponding to a first partial factor,
acquiring at least one second measurement data set of the target region of the examination object, wherein a second measurement data set does not sample a second region of the k-space to be sampled according to Nyquist and corresponding to a second partial factor, wherein the first region and the second region of the k-space are different from each other, and
creating a combined measurement data set on the basis of the acquired measurement data sets.

The acquisition time required for the acquisition of the measurement data sets is reduced by the acquisition of incomplete measurement data sets according to Nyquist and corresponding to a partial factor. A k-space region not acquired in any of the acquisitions made can be minimized by the inventive variation in the respective sampling pattern of the acquired measurement data sets, so artifacts in MR images reconstructed from the measurement data sets are avoided or at least reduced.

An inventive magnetic resonance system comprises a magnetic unit, a gradient unit, a radio-frequency unit and a controller with a measurement data supplementary unit configured to carry out an inventive method.

An inventive computer program implements an inventive method on a controller when it is run on the controller.

The computer program can also be in the form of a computer program product, which can be loaded directly into a memory of a controller, with program code means in order to carry out an inventive method when the computer program product is executed by the processor of the computing system.

An inventive electronically readable data carrier, such as a computer-readable storage medium, comprises electronically readable control information stored thereon, which comprises at least one inventive computer program and is configured in such a way that it carries out an inventive method when the data carrier is used in a controller of a magnetic resonance system.

The advantages and statements disclosed in relation to the method also apply analogously to the magnetic resonance system, the computer program product and the electronically readable data carrier.

FIG. 1 is a schematic flowchart of an inventive method for avoiding artifacts during the acquisition of MR data of an examination object.

A first measurement data set MDS1* of a target region of the examination object is acquired in this case, with the first measurement data set MDS1* not sampling a first region B1 of a k-space to be sampled according to Nyquist (Block 101) and corresponding to a first partial factor.

Furthermore, at least one second measurement data set MDS21* of the target region of the examination object is acquired, with the second measurement data set not sampling a second region B2 of the k-space to be sampled according to Nyquist (Block 103) and corresponding to a second partial factor.

The first region B1 and the second region B2 of the k-space are different from each other here. The applied partial factors lie for example between the value zero and the value one and indicate which portion of the k-space to be sampled according to Nyquist is acquired. At least one mean partial factor averaged over all partial factors applied in the acquisitions carried out is less than the value of one, so at least one region of the k-space to be sampled according to Nyquist is not sampled in at least one acquisition of measurement data sets, and thus no measurement data is acquired from this region in the affected at least one acquisition of measurement data sets.

Further second measurement data sets MDS22* to MDS2N*, where N is a natural number >1, can be acquired, with each further second measurement data set MDS22*, MDS2N* not sampling a further second region B2.2, . . . , B2.N of the k-space to be sampled according to Nyquist (Blocks 103' and 103") and corresponding to a further second partial factor. At least two of the non-sampled regions B1, B2, B2.2 . . . B2.N are different from each other, in particular all non-sampled regions B1, B2, B2.2 . . . B2.N are different from each other.

The respective non-sampled regions B1, B2, B2.2 . . . B2.N can be selected here in such a way that a combination of the acquired first measurement data set MDS1* and the acquired second measurement data sets MDS21*, MDS22* . . . MDS2N* comprises measurement data from the complete k-space that is entire according to Nyquist. In this way it is possible to ensure that all measurement data required according to Nyquist is acquired at least in one of the acquisitions made.

In addition or alternatively, the respective non-sampled regions B1, B2, B2.2 . . . B2.N can be selected here in such a way that the first acquired measurement data set MDS1* and at least one second acquired measurement data set MDS21*, MDS22* . . . MDS2N* or all acquired measurement data sets MDS1*, MDS21*, MDS22* . . . MDS2N* comprise measurement data from the central k-space region. Measurement data is acquired from the central k-space region important for the contrast in more than one acquisition by such a procedure, so the signal-to-noise ratio (SNR) can be improved.

The first and the at least one second measurement data set MDS1*, MDS21*, MDS22* . . . MDS2N* can be acquired segment-wise (segmented), and the first region B1 and each second region B2, B2.2 . . . B2.N comprises at least one segment of the segment-wise acquisition.

In particular, the first and the at least one second measurement data set MDS1*, MDS21*, MDS22* . . . MDS2N* can be acquired segment-wise in the readout direction, for example with the aid of a RESOLVE technique mentioned above.

Furthermore, in addition or alternatively, the respective non-sampled regions B1, B2, B2.2 . . . B2.N can be selected here in such a way that for acquisition of the first measurement data set MDS1* and the at least one second measurement data set MDS21*, MDS22* . . . MDS2N*, the first region B1 and respective second regions B2, B2.2 . . . B2.N are selected in such a way that the k-space acquisition density in all acquired measurement data sets MDS1*, MDS21*, MDS22* . . . MDS2N* approximates a function, for example a Gaussian function. This may be achieved particularly easily, for example with segment-wise acquisition, when a number of segments is provided that is sufficient for such an approximation. The partial factors used in each case during the first acquisition and during at least one second acquisition can be different here. An achievable image quality can be controlled by way of such a specification of an entire k-space acquisition density.

Figure 3:
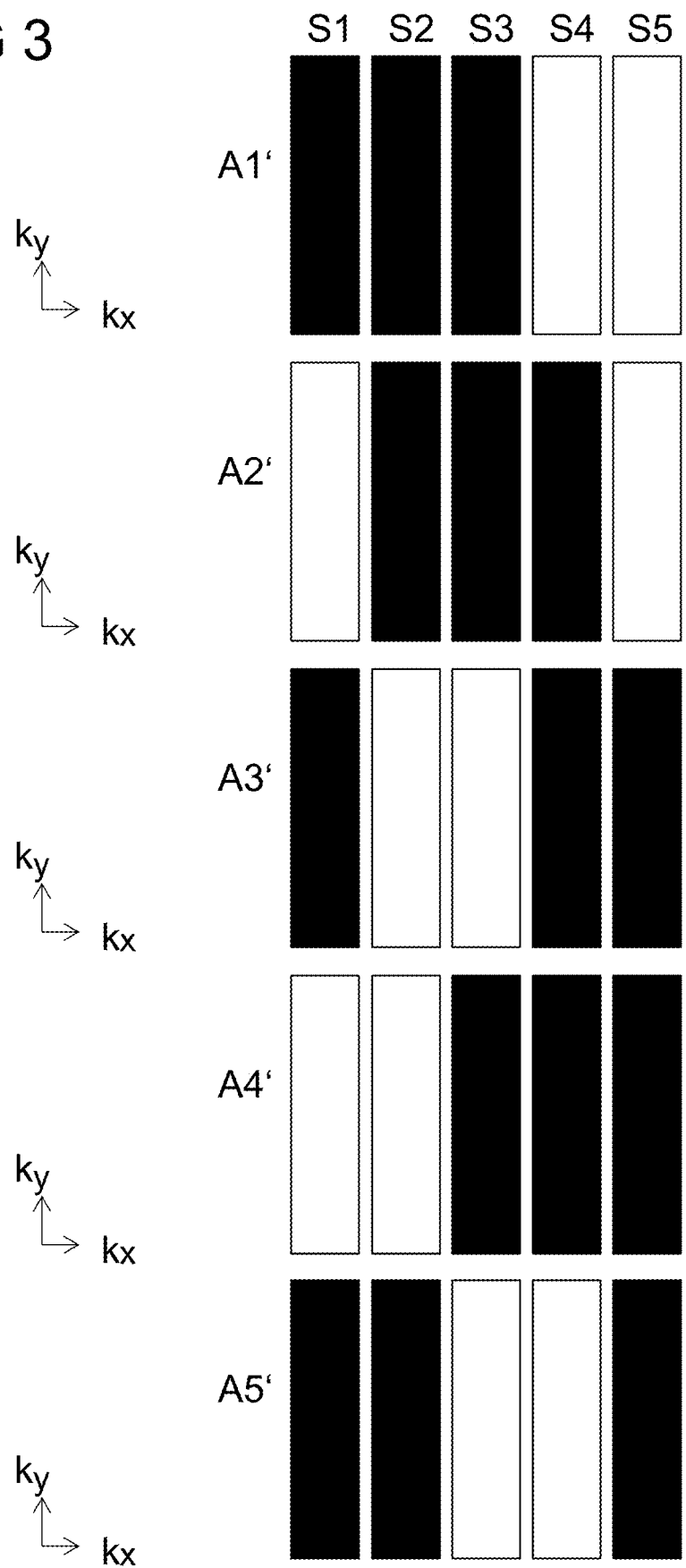
Figure 4:
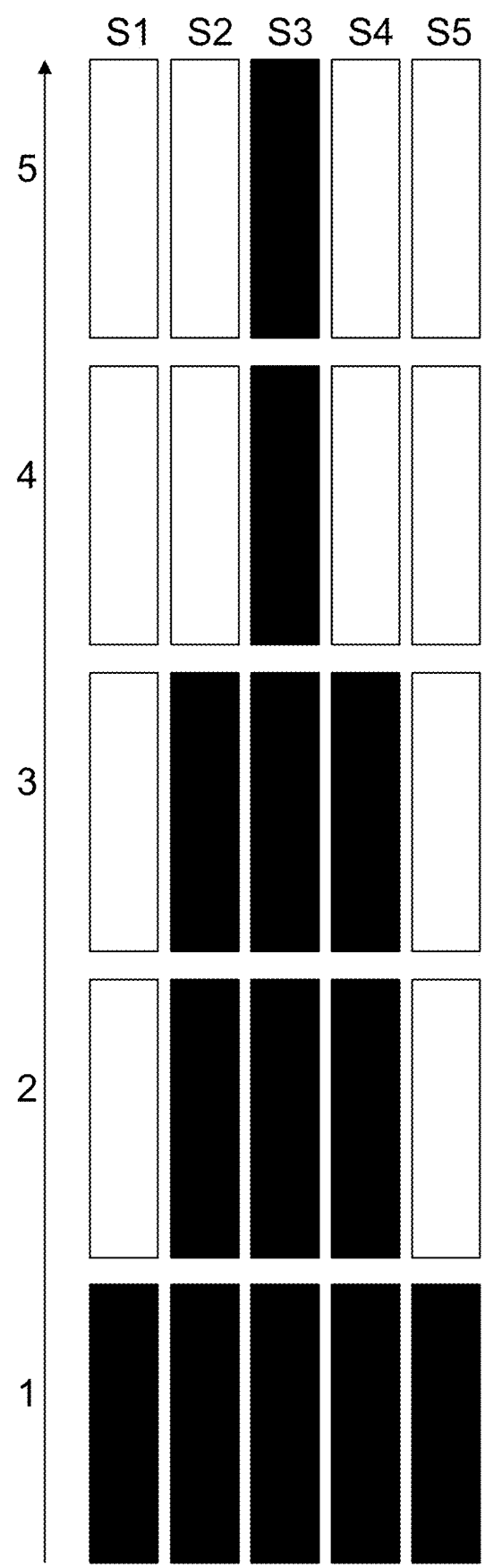

FIGS. 2 to 4 described in more detail below show examples of regions in the k-space from which measurement data is to be acquired, and regions that are not to be sampled for inventive first and second measurement data sets.

A combined measurement data set (MDS) is created (Block 105) on the basis of the acquired measurement data sets MDS1*, MDS21*, MDS22* . . . MDS2N*. In particular if measurement data was acquired at least once in all acquired measurement data sets MDS1*, MDS21*, MDS22* . . . MDS2N* from each region of the k-space required according to Nyquist, in other words if no region of the k-space required according to Nyquist was sampled in any of the acquisitions of measurement data sets MDS1*, MDS21*, MDS22* . . . MDS2N* carried out, a combined measurement data set MDS can be easily created by, for example, adding or averaging the acquired measurement data sets MDS1*, MDS21*, MDS22* . . . MDS2N*. It can be expedient in this case to compensate optionally different acquisition densities of the k-space. For this, creating the combined measurement data set MDS can comprise weighting of the acquired measurement data, for example according to the frequency with which they were acquired in the acquisitions made.

Creating the combined measurement data set (MDS) can comprise supplementing acquired measurement data sets (MDS1*, MDS21*, MDS22*, MDS2N*) to form in each case a supplemented measurement data set (MDS1, MDS21, MDS22, MDS2N) (Block 107).

The combined measurement data set MDS can then be created on the basis of the supplemented measurement data sets MDS1, MDS21, MDS22 . . . MDS2N (Block 105). For this, the supplemented measurement data sets MDS1, MDS21, MDS22 . . . MDS2N can, for example, be combined with each other, for example averaged, it being possible for the combination of the supplemented measurement data sets MDS1, MDS21, MDS22 . . . MDS2N to comprise a standardization and/or weighting, for example, in particular when a RESOLVE sequence is used for the acquisition of the measurement data, also for compensation of changes in phase in different (partial) acquisitions.

In a simple exemplary embodiment, supplementing at least one of the acquired measurement data sets MDS1*, MDS21*, MDS22*, MDS2N* can comprise filling with zeroes ("zero-filling"). Zero-filling is known in PF methods and is not associated with great computing effort.

Additionally or alternatively, supplementing at least one of the acquired measurement data sets MDS1*, MDS21*, MDS22*, MDS2N* can comprise a POCS method. A higher quality of the supplemented measurement data can be expected with iterative POCS methods than with pure zero-filling. The computing effort is increased for this in POCS compared to zero-filling.

In addition to customary consistency conditions in known POCS methods, a POCS method incorporated during supplementing at least one of the acquired measurement data sets MDS1*, MDS21*, MDS22*, MDS2N* can also comprise at least one of the following conditions:
i) consistency of supplemented measurement data of a non-sampled region of a first or second measurement data set with acquired measurement data of the same region of a different acquired measurement data set,
ii) consistency of the image phase of a measurement data set to be supplemented with an image phase of an acquired measurement data set different from the measurement data set to be supplemented.

An increased consistency, in particular between different acquired measurement data sets supplemented with such a POCS method, can be achieved by way of the at least one additional condition for the POCS method, which, aside from a measurement data set to be supplemented, also considers measurement data from an acquired measurement data set different from the measurement data set to be supplemented.

An acquired measurement data set can thus be supplemented using a different acquired measurement data set.

An image data set BDS with high image quality can be reconstructed (Block 109) from the combined measurement data set MDS.

FIG. 2 is an example of a sampling pattern of an acquisition A1 of a first measurement data set and an acquisition A2 of a second measurement data set. The k-space to be sampled according to Nyquist is illustrated in each case by circles. Filled circles correspond to sampled k-space points, and non-filled circles correspond to non-sampled k-space points, which are located in the regions B1 and B2.

In the example shown, ⅗ of the k-space is acquired in both acquisition A1 and in acquisition A2. The partial factor is thus P=⅗ in each case.

The non-sampled regions B1 and B2 are different in acquisitions A1 and A2. In the example shown, the non-sampled region B1 in acquisition A1 is located at the right-hand end of the k-space in the readout direction kx. No (further) non-sampling is shown in the phase encoding direction ky. Furthermore, non-sampled region B2 in acquisition A2 is located at the left-hand end of the k-space in the readout direction kx. Again no (further) non-sampling is shown in the phase encoding direction ky. The k-space center (at least in the readout direction) is thus acquired with both acquisition A1 and with acquisition A2. The entire k-space is acquired at least once with the two acquisitions A1 and A2, so all of the measurement data to be acquired according to Nyquist is sampled at least in one of acquisitions A1 and A2 and thus information is captured over the entire required k-space.

The acquisitions A1 and A2 could be acquired in segments. In this case, for example the outlined segments S1, S2, S3, S4 and S5, could be acquired in such a way that in acquisition A1 only the segments S1, S2 and S3 are acquired—the segments S4 and S5 thus correspond to the region B1, and that in acquisition A2 only the segments S3, S4 and S5 are acquired—the segments S1 and S2 then correspond to the region B2.

FIGS. 3 and 4 show further examples of measurement data to be acquired in the k-space and regions not to be sampled, with, for example, acquisitions A1', A2', A3', A4' and A5' being illustrated here with which first and second measurement data sets are acquired. Since it is sufficient for clarification of the underlying principle, the k-space to be sampled in each case according to Nyquist is illustrated by way of example in five segments S1, S2, S3, S4 and S5 in FIGS. 3 and 4 for each acquisition, with measurement data being acquired from segments shown as filled, and "empty" segments not being sampled.

In the example shown in FIG. 3, only the segments S1, S2 and S3 are acquired in acquisition A1' of a first measurement data set, whereas the segments S4 and S5 together correspond to the non-sampled region B1 in this acquisition A1'.

In the acquisition A2' of a second measurement data set, only the segments S2, S3 and S4 are acquired, whereas the segments S1 and S5 together correspond to the non-sampled region B2 in this acquisition A2'.

In the acquisition A3' of a first further second measurement data set, only the segments S1, S4 and S5 are acquired, whereas the segments S2 and S3 together correspond to the non-sampled region B2.2 in this acquisition A3'.

In the acquisition A4' of a second further second measurement data set only the segments S3, S4 and S5 are acquired, whereas the segments S1 and S2 together correspond to the non-sampled region B2.3 in this acquisition A4'.

In the acquisition A5' of a third further second measurement data set, only the segments S1, S2 and S5 are acquired, whereas the segments S3 and S4 together correspond to the non-sampled region B2.4 in this acquisition A5'.

Thus, in the example of FIG. 3, the acquired segments for each acquisition of a measurement data set A1' to A5' are varied such that a consistent sampling pattern results over the acquisition series A1' to A5', and all segments S1 to S5 are consistently often acquired (three times) in different acquisitions. This method is particularly preferred if the non-sampled regions are to be supplemented without a dedicated partial Fourier reconstruction, but rather, for example, by zero-filling. An intensity correction for aligning the intensities of the measurement data acquired in the different acquisitions A1' . . . A5' can be avoided by the consistent sampling since it is anticipated that intensities that are already similar are present.

The example illustrated in FIG. 4 represents a k-space density histogram, which approximates a desired k-space acquisition density as a Gaussian function. As can be seen in the k-space density histogram, the segments S1, S2, S3, S4 and S5 are acquired in the framework of at least five acquisitions of measurement data sets, with the segments S1 and S5 being acquired in one (1) of the at least five acquisitions, the segments S2 and S3 being acquired in three (3) of the at least five acquisitions, and the segment S3 being acquired in five (5) of the at least five acquisitions. A k-space density histogram shown can be achieved with a maximum of thirteen acquisitions of measurement data sets, which then comprised in each case only measurement data of a single one of the segments S1 to S5.

If exactly five acquisitions of (thus five) measurement data sets are carried out, which should produce an illustrated k-space density histogram, the segment S3 is never part of a respective non-sampled region in the five acquisitions, but in four of the five acquisitions the segments S1 and S5 are part of a respective non-sampled region, and the segments S2 and S4 are part of a respective non-sampled region in two of the five acquisitions. Which segments are acquired in which of the five acquisitions of measurement data sets, and which are not sampled in each case, can be freely selected otherwise while adhering to the conditions cited in this paragraph.

In a simple example, five acquisitions of measurement data sets could acquire measurement data as follows:

In a first acquisition of a first measurement data set, only the segment S3 could be acquired, whereas the segments S1, S2, S4 and S5 together would correspond to the non-sampled region B1 in this first acquisition.

In a second acquisition of a second measurement data set, likewise only the segment S3 could be acquired, whereas the segments S1, S2, S4 and S5 together would correspond to the non-sampled region B2 in this second acquisition.

In a third acquisition of a first further second measurement data set, only the segments S2, S3 and S4 could be acquired, whereas the segments S1 and S2 together would correspond to the non-sampled region B2.2 in this third acquisition.

In a fourth acquisition of a second further second measurement data set, likewise only the segments S2, S3 and S4 could be acquired, whereas the segments S1 and S2 together would correspond to the non-sampled region B2.3 in this fourth acquisition.

In a fifth acquisition of a third further second measurement data set, all segments S1, S2, S3, S4 and S5 could be acquired. The region B2.4 of this further second measurement data set would thus be empty, but there exist regions (B1, B2, B2.2, B2.3) from which no measurement data is acquired in at least one of the acquisitions since it is not sampled there.

An actual number of acquisitions of measurement data sets to achieve an illustrated k-space density histogram, and an associated assignment of regions to be acquired in the respective acquisitions, here for example by assignment of segments to be acquired, and regions not to be sampled, can however, as stated, be freely selected for example according to the application, taking into consideration the desired k-space acquisition density.

A procedure of this kind thus also enables a freer selection of the partial factors to be applied to the individual acquisitions of measurement data sets, so, for example averaged over the acquisitions, the desired partial factor can be achieved in order to accelerate the entire acquisition duration. More frequent acquisition of central k-space segments results in an improved signal-to-noise ratio in image data sets reconstructed from the combined measurement data sets.

As shown in the example of FIG. 4, acquired regions of the k-space can be selected for each acquisition of a measurement data set such that a desired k-space acquisition density, and thus a desired k-space density weighting, of the acquired segments is achieved. In particular, the segments acquired in the acquisitions carried out can be selected such that the k-space acquisition density approximates a desired function, for example a Gaussian function.

This procedure is particularly advantageous if there is a sufficiently high number of k-space segments for the approximation of the desired function, and/or if the desired number of acquisitions of measurement data sets together with a desired partial factor does not enable uniform k-space sampling.

Figure 5:
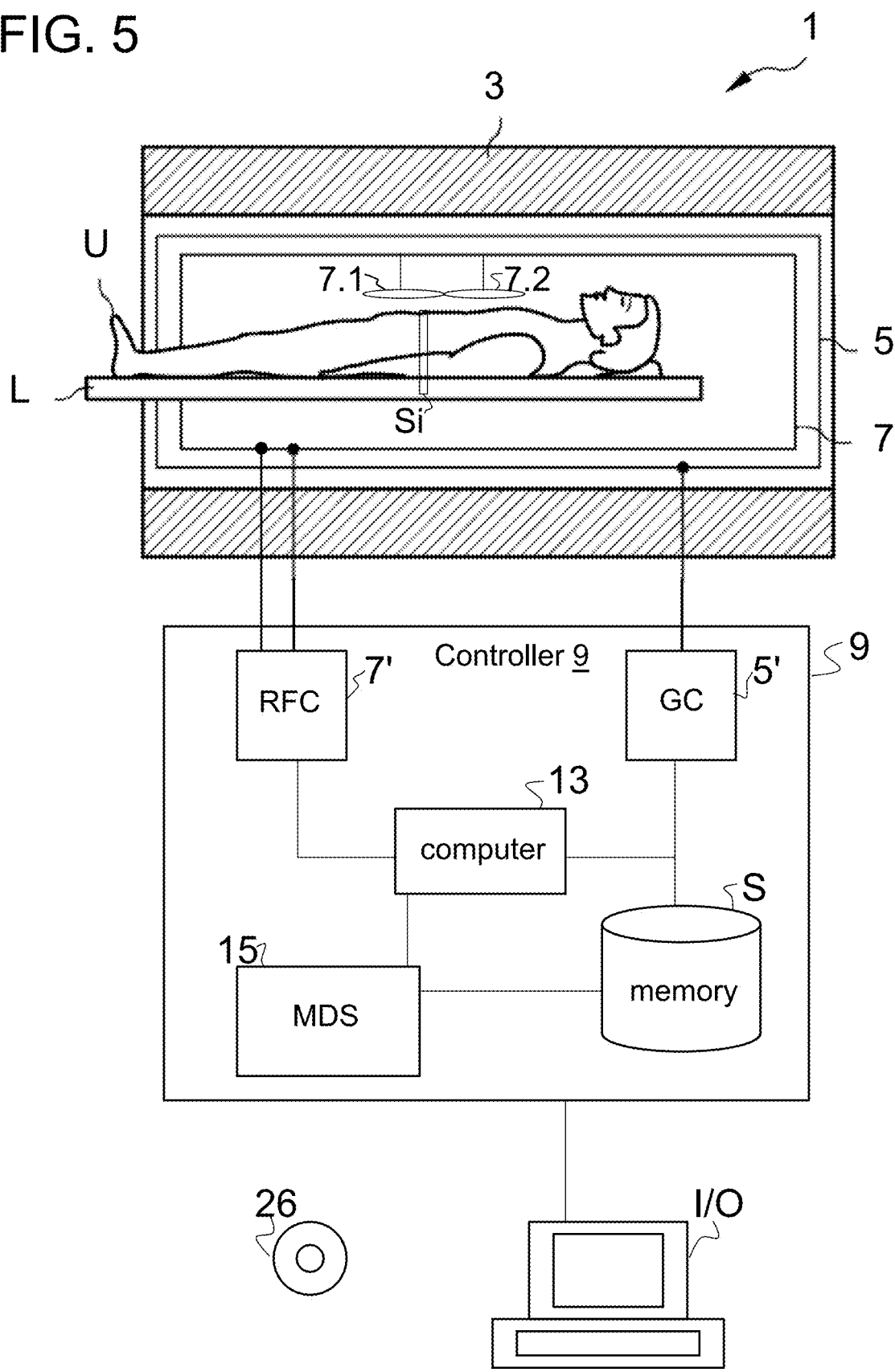
FIG. 5 shows a magnetic resonance system according to an exemplary embodiment of the disclosure.

FIG. 5 schematically illustrates an inventive magnetic resonance system 1. It comprises a magnetic unit 3 for generation of the basic magnetic field, a gradient unit 5 for generation of the gradient fields, a radio-frequency unit 7 for irradiating and for receiving radio-frequency signals and a controller 9 designed to carry out an inventive method.

In FIG. 5 these partial units of the magnetic resonance system 1 are shown only roughly schematically. In particular, the radio-frequency (RF) unit 7 can be composed of a plurality of subunits, for example of a plurality of coils such as the schematically shown coils 7.1 and 7.2 or more coils, which can be configured either only for transmitting radio-frequency signals or only for receiving the triggered radio-frequency signals or for both.

For examination of an examination object U, for example of a patient or also of a phantom, the object can be introduced on a couch L into the magnetic resonance system 1, into the measuring volume thereof. The slice or the slab Si represents an exemplary target volume of the examination object from which echo signals are to be acquired and captured as measurement data.

The controller 9 is configured to control the magnetic resonance system 1, including controlling the gradient unit 5 by means of a gradient controller 5' and the radio-frequency unit 7 by means of a radio-frequency transmitting/receiving controller 7'. The radio-frequency unit 7 can comprise a plurality of channels here on which signals can be transmitted or received.

The radio-frequency unit 7, together with its radio-frequency transmitting/receiving controller 7', is responsible for the generation and irradiating (emitting) of a radio-frequency alternating field for manipulation of the spins in a region to be manipulated (for example in slices S to be measured) of the examination object U. As a rule, the center frequency of the radio-frequency alternating field, also referred to as the B1 field, is optimally set such that it lies close to the resonance frequency of the spins to be manipulated. Deviations from the center frequency by the resonance frequency are referred to as off-resonance. Currents controlled by means of the radio-frequency transmitting/receiving controller 7' are applied to the RF coils in the radio-frequency unit 7 in order to generate the B1 field. In an exemplary embodiment, the controller 9 (and/or one or more components therein) includes processing circuitry that is configured to perform one or more functions of the controller 9 (and/or the functions of the respective components).

Furthermore, the controller 9 comprises a measurement data supplementary processor 15 with which inventive supplementations of first and second measurement data sets can be made. The controller 9 is designed as a whole to carry out an inventive method.

A computer 13 incorporated by the controller 9 is configured to carry out all computing operations necessary for the necessary measurements and determinations. Intermediate results and results required or ascertained here for this can be stored in a memory S of the controller 9. The illustrated units should not necessarily be taken to mean physically separate units here, rather they merely represent a subdivision into expedient units, which can also be implemented, for example, in fewer units or also in only one single physical unit. In an exemplary embodiment, an external memory may be implemented in addition or alternatively to the memory S.

Control commands can be conveyed to the magnetic resonance system and/or events of the controller 9, such as image data, can be displayed, for example by a user, by way of an input/output facility I/O of the magnetic resonance system 1. The I/O may be a computer, such as a general-purpose computer in one or more aspects.

A method described herein can also be in the form of a computer program product, which comprises a program, and the described method can be implemented on a controller 9 when it is run on the controller 9. Similarly, an electronically readable data carrier 26 with electronically readable control information stored thereon can be present, which comprises at least one such just-described computer program product and is designed in such a way that it carries out the described method when the data carrier 26 is used in a controller 9 of a magnetic resonance system 1.

CONCLUSION

The aforementioned description will so fully reveal the general nature of the implementation of the disclosure that others can, by applying knowledge within the skill of the art, readily modify and/or adapt for various applications such specific implementations without undue experimentation and without departing from the general concept of the present disclosure. Therefore, such adaptations and modifications are intended to be within the meaning and range of equivalents of the disclosed implementations, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Each implementation described may include a particular feature, structure, or characteristic, but every implementation may not necessarily include the particular feature, structure, or characteristic. Moreover, such phrases are not necessarily referring to the same implementation. Further, when a particular feature, structure, or characteristic is described in connection with an implementation, it is submitted that it is within the knowledge of one skilled in the art to affect such feature, structure, or characteristic in connection with other implementations whether or not explicitly described.

The exemplary implementations described herein are provided for illustrative purposes, and are not limiting. Other implementations are possible, and modifications may be made to the exemplary implementations. Therefore, the specification is not meant to limit the disclosure. Rather, the scope of the disclosure is defined only in accordance with the following claims and their equivalents.

The designs of the disclosure may be implemented in hardware (e.g., circuits), firmware, software, or any combination thereof. Designs may also be implemented as instructions stored on a machine-readable medium, which may be read and executed by one or more processors. A machine-readable medium may include any mechanism for storing or transmitting information in a form readable by a machine (e.g., a computing device). A machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

Throughout the drawings, it should be noted that like reference numbers are used to depict the same or similar elements, features, and structures, unless otherwise noted.

The terms "at least one" and "one or more" may be understood to include a numerical quantity greater than or equal to one (e.g., one, two, three, four, [ . . . ], etc.). The term "a plurality" may be understood to include a numerical quantity greater than or equal to two (e.g., two, three, four, five, [ . . . ], etc.).

The words "plural" and "multiple" in the description and in the claims expressly refer to a quantity greater than one. Accordingly, any phrases explicitly invoking the aforementioned words (e.g., "plural [elements]", "multiple [elements]") referring to a quantity of elements expressly refers to more than one of the said elements. The terms "group (of)", "set (of)", "collection (of)", "series (of)", "sequence (of)", "grouping (of)", etc., and the like in the description and in the claims, if any, refer to a quantity equal to or greater than one, i.e., one or more. The terms "proper subset", "reduced subset", and "lesser subset" refer to a subset of a set that is not equal to the set, illustratively, referring to a subset of a set that contains less elements than the set.

The phrase "at least one of" with regard to a group of elements may be used herein to mean at least one element from the group consisting of the elements. The phrase "at least one of" with regard to a group of elements may be used herein to mean a selection of: one of the listed elements, a plurality of one of the listed elements, a plurality of individual listed elements, or a plurality of a multiple of individual listed elements.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term "data", however, is not limited to the aforementioned data types and may take various forms and represent any information as understood in the art.

The terms "processor," "processing circuitry," or "controller" as used herein may be understood as any kind of technological entity that allows handling of data. The data may be handled according to one or more specific functions executed by the processor, processing circuitry, or controller. Further, processing circuitry, a processor, or a controller as used herein may be understood as any kind of circuit, e.g., any kind of analog or digital circuit. Processing circuitry, a processor, or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as processing circuitry, a processor, controller, or logic circuit. It is understood that any two (or more) of the processors, controllers, logic circuits, or processing circuitries detailed herein may be realized as a single entity with equivalent functionality or the like, and conversely that any single processor, controller, logic circuit, or processing circuitry detailed herein may be realized as two (or more) separate entities with equivalent functionality or the like.

As used herein, "memory" is understood as a computer-readable medium in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, among others, or any combination thereof. Registers, shift registers, processor registers, data buffers, among others, are also embraced herein by the term memory. The term "software" refers to any type of executable instruction, including firmware.

In one or more of the implementations described herein, processing circuitry can include memory that stores data and/or instructions. The memory can be any well-known volatile and/or non-volatile memory, including read-only memory (ROM), random access memory (RAM), flash memory, a magnetic storage media, an optical disc, erasable programmable read only memory (EPROM), and programmable read only memory (PROM). The memory can be non-removable, removable, or a combination of both.

Unless explicitly specified, the term "transmit" encompasses both direct (point-to-point) and indirect transmission (via one or more intermediary points). Similarly, the term "receive" encompasses both direct and indirect reception. Furthermore, the terms "transmit," "receive," "communicate," and other similar terms encompass both physical transmission (e.g., the transmission of radio signals) and logical transmission (e.g., the transmission of digital data over a logical software-level connection). Processing circuitry, a processor, or a controller may transmit or receive data over a software-level connection with another processor, controller, or processing circuitry in the form of radio signals, where the physical transmission and reception is handled by radio-layer components such as RF transceivers and antennas, and the logical transmission and reception over the software-level connection is performed by the processors or controllers. The term "communicate" encompasses one or both of transmitting and receiving, i.e., unidirectional or bidirectional communication in one or both of the incoming and outgoing directions. The term "calculate" encompasses both 'direct' calculations via a mathematical expression/formula/relationship and 'indirect' calculations via lookup or hash tables and other array indexing or searching operations.

The systems and methods of the disclosure may utilize one or more machine learning models to perform corresponding functions described herein. The term "model" as, for example, used herein may be understood as any kind of algorithm, which provides output data from input data (e.g., any kind of algorithm generating or calculating output data from input data). A machine learning model may be executed by a computing system to progressively improve performance of a specific task. According to the disclosure, parameters of a machine learning model may be adjusted during a training phase based on training data. A trained machine learning model may then be used during an inference phase to make predictions or decisions based on input data.

The invention claimed is:

1. A method for avoiding artifacts during the acquisition of magnetic resonance (MR) data of an examination object, the method comprising:
controlling a MR scanner to acquire, segment-wise in a readout direction, a first measurement data set of a target region of the examination object, wherein the first measurement data set excludes a sample of a first region of k-space sampleable according to Nyquist and corresponding to a first partial factor;
controlling the MR scanner to acquire, segment-wise in the readout direction, a second measurement data set of the target region of the examination object, the second measurement data set excluding a sample of a second region of k-space sampleable according to Nyquist and corresponding to a second partial factor, and the first region and the second region each include at least one segment of the segment-wise acquisition, wherein the first region and the second region are different from each other; and
creating a combined measurement data set based on the acquired first and second measurement data sets.

2. The method as claimed in claim 1, wherein a combination of the acquired first measurement data set and the acquired second measurement data set each include measurement data from the entire complete k-space according to Nyquist.

3. The method as claimed in claim 1, wherein the first acquired measurement data set and the second acquired measurement data set include measurement data from a central region of k-space.

4. The method as claimed in claim 1, wherein for the acquisition of the first measurement data set and the second measurement data set, the first region and the second region are selected such that a k-space acquisition density in all acquired measurement data sets approximates a function.

5. The method as claimed in claim 4, wherein the approximated function is a Gaussian function.

6. The method as claimed in claim 1, wherein creating the combined measurement data set comprises: supplementing the acquired first and second measurement data sets to form respective first and second supplemented measurement data sets, the combined measurement data set being created based on the first and second supplemented measurement data sets.

7. The method as claimed in claim 6, wherein supplementing the first measurement data set and/or the second measurement data set comprises filling the first measurement data set and/or the second measurement data set with zeroes.

8. The method as claimed in claim 6, wherein supplementing the first measurement data set and/or the second measurement data set comprises a projections onto convex sets (POCS) method.

9. The method as claimed in claim 8, wherein the POCS method comprises:
i) a consistency of supplemented measurement data of a non-sampled region of a first or second measurement data set with acquired measurement data of a same region of a different acquired measurement data set, and/or
ii) a consistency of an image phase of a measurement data set to be supplemented with an image phase of an acquired measurement data set different from the measurement data set to be supplemented.

10. The method as claimed in claim 1, wherein a mean partial factor averaged over all partial factors used in the acquisitions carried out is less than one.

11. A non-transitory computer-readable storage medium with an executable program stored thereon, that when executed, instructs a processor to perform the method of claim 1.

12. A computer program product, embodied on a non-transitory computer-readable storage medium, including a computer program code and that is loadable into a memory of a controller of a magnetic resonance system, when the computer program code is executed by the controller, causes the controller to perform the method of claim 1.

13. The method as claimed in claim 1, wherein at least one of the first and second regions of k-space corresponding to a partial factor extends through all of the measured k-space in a phase-encoding direction and includes only a portion of the measured k-space in the readout direction.

14. A magnetic resonance (MR) system comprising:
 a scanner; and
 a controller configured to:
  control the scanner to acquire, segment-wise in a readout direction, a first measurement data set of a target region of the examination object, wherein the first measurement data set excludes a sample of a first region of k-space sampleable according to Nyquist and corresponding to a first partial factor;
  control the scanner to acquire, segment-wise in the readout direction, a second measurement data set of the target region of the examination object, the second measurement data set excluding a sample of a second region of k-space sampleable according to Nyquist and corresponding to a second partial factor, and the first region and the second region each include at least one segment of the segment-wise acquisition, wherein the first region and the second region are different from each other; and
  create a combined measurement data set based on the acquired first and second measurement data sets.

15. The MR system as claimed in claim 14, wherein the scanner comprises a magnetic unit, a gradient unit, and a radio-frequency unit, and the controller comprises a radio-frequency transmitting/receiving controller and a measurement data supplementary unit.

16. A method for avoiding artifacts during the acquisition of magnetic resonance (MR) data of an examination object, the method comprising:
 controlling a MR scanner to acquire a first measurement data set of a target region of the examination object, wherein the first measurement data set excludes a sample of a first region of k-space sampleable according to Nyquist and corresponding to a first partial factor;
 controlling the MR scanner to acquire a second measurement data set of the target region of the examination object, the second measurement data set excluding a sample of a second region of k-space sampleable according to Nyquist and corresponding to a second partial factor, wherein the first region and the second region are different from each other; and
 creating a combined measurement data set based on the acquired first and second measurement data sets, wherein:
 for the acquisition of the first measurement data set and the second measurement data set, the first region and the second region are selected such that a k-space acquisition density in all acquired measurement data sets approximates a function;
 creating the combined measurement data set includes supplementing the acquired first and second measurement data sets to form respective first and second supplemented measurement data sets, the combined measurement data set being created based on the first and second supplemented measurement data sets, and supplementing the first measurement data set and/or the second measurement data set including a projections onto convex sets (POCS) method; or
 a mean partial factor averaged over all partial factors used in the acquisitions carried out is less than one.

17. A magnetic resonance (MR) system comprising: a scanner; and a controller configured to perform the method of claim 16.

* * * * *